(12) United States Patent
Tanida et al.

(10) Patent No.: US 8,670,182 B2
(45) Date of Patent: Mar. 11, 2014

(54) ALKALI-FREE COVER GLASS COMPOSITION, AND LIGHT EXTRACTING MEMBER USING SAME

(71) Applicant: Asahi Glass Company, Limited, Tokyo (JP)

(72) Inventors: Masamichi Tanida, Tokyo (JP); Naoya Wada, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/750,841

(22) Filed: Jan. 25, 2013

(65) Prior Publication Data

US 2013/0135745 A1      May 30, 2013

Related U.S. Application Data

(63) Continuation of application No. PCT/JP2011/066951, filed on Jul. 26, 2011.

(30) Foreign Application Priority Data

Jul. 26, 2010   (JP) .................................. 2010-167092

(51) Int. Cl.
    *G02B 5/02*   (2006.01)
(52) U.S. Cl.
    USPC ............................................. 359/599; 501/11
(58) Field of Classification Search
    None
    See application file for complete search history.

(56) References Cited

U.S. PATENT DOCUMENTS

| | | | |
|---|---|---|---|
| 6,255,239 B1 * | 7/2001 | Sakoske | 501/77 |
| 6,786,064 B2 * | 9/2004 | Hayashi et al. | 65/32.1 |
| 2007/0249483 A1 | 10/2007 | Ritter et al. | |
| 2008/0039309 A1 | 2/2008 | Wolff et al. | |
| 2008/0272367 A1 * | 11/2008 | Cok | 257/40 |
| 2009/0153972 A1 | 6/2009 | Nakamura et al. | |
| 2011/0284907 A1 | 11/2011 | Nakamura et al. | |

FOREIGN PATENT DOCUMENTS

| | | |
|---|---|---|
| JP | 2007-119343 | 5/2007 |
| JP | 2008-044837 | 2/2008 |
| JP | 2008-273751 | 11/2008 |
| WO | WO 2009/017035 A1 | 2/2009 |

OTHER PUBLICATIONS

International Search Report cited in related International Patent Application No. PCT/JP2011/066951, completed Aug. 24, 2011.

* cited by examiner

*Primary Examiner* — Stephone B Allen
*Assistant Examiner* — Jyotsna Dabbi
(74) *Attorney, Agent, or Firm* — Foley & Lardner LLP

(57) ABSTRACT

A glass composition and a light extracting member using the same is provided, where the glass composition does not substantially contain a lead oxide and an alkali metal oxide and has a glass transition temperature of 530° C. or less and acid resistance property. An alkali-free cover glass composition is also provided which does not substantially contain a lead oxide and an alkali metal oxide; has a refractive index ($n_d$) of 1.7 to 2.3; has a glass transition temperature of 530° C. or less; has a dissolution depth of less than 1.3 μm as measured by an acid dipping weight loss measurement method; and contains 8 to 25% of $Nb_2O_5$ in terms of mol % on the basis of an oxide thereof.

4 Claims, 1 Drawing Sheet

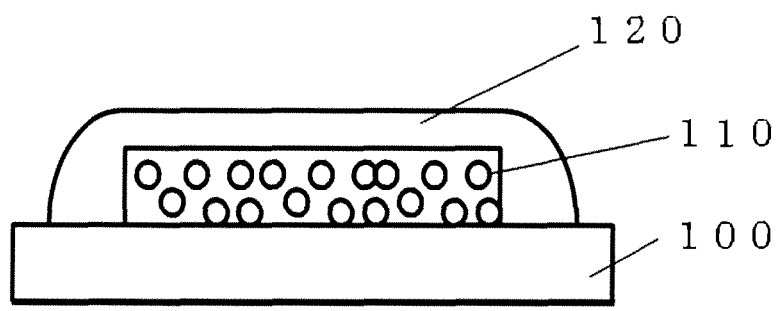

ALKALI-FREE COVER GLASS COMPOSITION, AND LIGHT EXTRACTING MEMBER USING SAME

TECHNICAL FIELD

The present invention relates to a glass composition and a light extracting member using the same, where the glass composition does not contain a lead oxide and an alkali metal oxide and has a high refractive index, a glass transition temperature of 530° C. or less, and acid resistance.

BACKGROUND ART

The conventional glass composition as disclosed in Patent Document 1 requires 13 to 21% of $GeO_2$ in terms of weight % on the basis of an oxide thereof. In addition, the glass composition as disclosed in Patent Document 2 needs an alkali metal oxide.

BACKGROUND ART DOCUMENTS

Patent Documents

Patent Document 1: JP-A-2007-119343
Patent Document 2: WO 2009/017035

SUMMARY OF THE INVENTION

Problems that the Invention is to Solve

However, the glass of Patent Documents 1 and 2 contains alkali metals and thus cause problems regarding alkali migration.

However, the glass composition of Patent Document 1 requires $GeO_2$, which is a rare material and causes problems of resource depletion and costs. The glass material of Patent Document 2 contains alkali metal oxides. In the case of forming a fired layer by baking the glass material on a glass plate, the fired film glass is softened during the baking process, so that the alkali metal contained in the glass plate and the alkali metal contained in the fired film glass are easily diffused mutually, causing a so-called ion-exchange reaction. When the ion-exchange reaction takes place, the difference in atomic radius between the alkali metal elements results in the generation of the residual stress in the fired film and glass substrate during a cooling process, or the reacted part of the fired film glass and substrate glass is changed to a glass differing in thermal expansion, thereby generating the residual stress between the reacted part and the unreacted part during the cooling process. This may lead to a warpage of the substrate, potentially causing a problem that a flat substrate surface cannot be obtained. In other words, a glass composition and a light extracting member (hereinafter, referred to as "glass composition or the like"), in which the glass composition does not contain a lead oxide and an alkali metal oxide and has a high refractive index (refractive index at d-line is 1.7 to 2.3), a glass transition temperature of 530° C. or less and acid resistance, have not been existed.

The present invention is to provide a glass composition and a light extracting member using the same in which the glass composition does not contain a lead oxide and an alkali metal oxide and has a glass transition temperature of 530° C. or less, acid resistance, and a refractive index ($n_d$) of 1.7 to 2.3.

Means for Solving the Problems

The present invention provides the following alkali-free cover glass composition and light extracting member using the same.

(1) An alkali-free cover glass composition, which: does not substantially contain a lead oxide and an alkali metal oxide; has a refractive index ($n_d$) of 1.7 to 2.3; has a glass transition temperature of 530° C. or less; has a dissolution depth of less than 1.3 μm as measured and calculated by an acid dipping weight loss measurement method; and contains 8 to 25% of $Nb_2O_5$ in terms of mol % on the basis of an oxide thereof.

(2) An alkali-free cover glass composition, comprising, in terms of mol % on the basis of oxides thereof:
4 to 32% of ZnO;
5 to 35% of $Bi_2O_3$;
10 to 30% of $P_2O_5$;
8 to 25% of $Nb_2O_5$; and
0 to 5% of BaO,
wherein when a content of the $Bi_2O_3$ is 30 mol % or more, $ZrO_2$ is contained in an amount of 1 to 5%,
a value obtained by dividing a sum of a content of the $Bi_2O_3$ and a content of the BaO by a content of the $Nb_2O_5$ is 0.3 to 2.5, and
the alkali-free cover glass composition does not substantially contain a lead oxide and an alkali metal oxide.

(3) The alkali-free cover glass composition according to (2), comprising, in terms of mol % on the basis of oxides thereof:
0 to 17% of $B_2O_3$;
0 to 5% of $ZrO_2$;
0 to 5% of MgO;
0 to 5% of CaO;
0 to 5% of BaO;
0 to 5% of SrO;
0 to 5% of $TiO_2$;
0 to 5% of $V_2O_5$;
0 to 5% of $MoO_3$; and
0 to 20% of $WO_3$.

(4) A light extracting member, comprising:
a substrate;
a light-scattering layer having a light-scattering property and being placed on the substrate; and
an alkali-free cover glass layer being placed on the light-scattering layer and composed of a glass composition, wherein the glass composition does not substantially contain a lead oxide and an alkali metal oxide; has a refractive index ($n_d$) of 1.7 to 2.3; has a glass transition temperature of 530° C. or less; has a dissolution depth of less than 1.3 μm as measured by an acid dipping weight loss measurement method; and contains 8 to 25% of $Nb_2O_5$ in terms of mol % on the basis of an oxide thereof.

Advantage of the Invention

According to the present invention, a specified glass composition is used to provide a glass composition and a light extracting member using the same, where the glass composition does not contain a lead oxide and an alkali metal oxide and has a high refractive index, a glass transition temperature of 530° C. or less, and acid resistance. Particularly, the present invention can provide a glass frit suitable for the cover layer of a scattering layer that enhances light extraction of an organic LED. The glass of the present invention is substantially free from alkali metals and thus does not have an adverse effect caused by alkali migration on the organic LED devices. The glass of the present invention has sufficiently high acid resistance and thus enables to pattern an ITO thin film formed on the glass by etching with an acid. Further, the glass frit of the present invention can achieve the effects that, after the glass frit is fired and softened on the glass substrate (for example, PD200 substrate, manufactured by Asahi Glass Co., Ltd.), deformation of the substrate and unacceptable warpage of the substrate are not occurred, and cracks of the substrate are also not occurred.

BRIEF DESCRIPTION OF THE DRAWINGS

FIG. 1 is a cross-sectional view of a light extracting member including an alkali-free cover glass of the present invention.

MODE FOR CARRYING OUT THE INVENTION

The alkali-free cover glass composition (hereinafter, referred to as "glass composition") of the present invention does not substantially contain a lead oxide and an alkali metal oxide; has a refractive index ($n_d$) of 1.7 to 2.3; has a glass transition temperature of 530° C. or less; has a dissolution depth of less than 1.3 μm; and contains 8 to 25% of $Nb_2O_5$ in terms of mol % on the basis of an oxide thereof, where the dissolution depth is determined by the measurement method (hereinafter, referred to as "acid dipping weight loss measurement method") in which a measurement sample is dipped in a so-called ITO etchant solution composed of a 1:1 mixed solution of 45° Baumé ferric chloride (42 wt. % or more of $FeCl_3$) and hydrochloric acid (35 wt. % of HCl) at 40° C. for 10 minutes to measure the weight loss between before and after the dipping, and the dissolution depth is calculated from the weight loss, and the specific gravity and surface area of the measurement sample.

The glass composition of the present invention does not substantially contain a lead oxide and an alkali metal oxide. In the present invention, the expression "does not substantially contain" means that these are not actively contained, but does not mean that these as impurities derived from other ingredients are not contained.

The glass composition of the present invention has a refractive index ($n_d$) of 1.7 to 2.3. In the case of applying onto the scattering layer of organic LED devices, if the refractive index is within this range, the effect that an emitted light is extracted is highly achieved. The refractive index ($n_d$) of the glass composition of the present invention is preferably 1.88 to 2.2, more preferably 1.95 to 2.1.

The refractive index ($n_d$) as used herein indicates a refractive index at d-line (587.56 nm) and can be determined by using the V block method with a digital precise refractive index detector (KPR-2000, manufactured by Kalnew Optical Industries) after the glass is polished.

The glass composition of the present invention has a glass transition temperature of 530° C. or less. The glass transition temperature of 530° C. or less leads to a glass softening temperature of 620° C. or less and a firing temperature, being capable of forming an alkali-free cover glass, of 620° C. or less, making it possible to suppress thermal deformation of the glass substrate having a high strain point (strain point of 570° C. or more) on the base material during the firing step. The glass transition temperature of the glass composition of the present invention is preferably 520° C. or less, more preferably 515° C. or less.

Further, the glass composition of the present invention has a glass transition temperature of 400° C. or more. For the glass having a glass transition temperature below 400° C., the glass composition is required to contain a large quantity of $Bi_2O_3$, which results in a high value of the thermal expansion coefficient and the generation of the residual stress during the formation of a fired film and causes the warpage of the substrate. Further, when the glass transition temperature is below 400° C., when a resin required for securing coatability is burnt down by firing, the softness of the glass is started at a low temperature and the resin is insufficiently burnt down.

The glass transition temperature can be measured by determining the first bending point from a DTA chart obtained using a differential thermal analysis apparatus TG8110, manufactured by Rigaku Corp. The glass softening temperature can be measured by determining the fourth folding point from a DTA chart obtained using the same apparatus.

The glass composition of the present invention has a dissolution depth of less than 1.3 μm as measured by the above-mentioned acid dipping weight loss measurement method. When the dissolution depth is less than 1.3 μm, it is adequate in patterning the ITO film formed on the fired film of the alkali-free cover glass by etching. More specifically, when the ITO is patterned, the fired film which is not subject to masking is also dissolved together. However, the expression "the dissolution depth of less than 1.3 m" has a meaning that it is less than a half of the eroded depth of the ITO. Such a dissolution depth prevents the inexpedience regarding the light-emitting layer to be formed in the latter step or treatment of wiring. The dissolution depth of the glass composition of the present invention is preferably 1.0 μm or less, more preferably 0.5 μm or less. Further, the dissolution depth is 0 or more, and no dissolution is preferred. Actually, the time required to pattern the ITO having a thickness of about 130 nm is about 30 seconds. "1.3 μm for 10 minutes" is calculated to be "65 nm for 30 seconds". In other words, it is believed that the dissolution depth is required to be not more than a half of the erosion rate of the ITO film.

Preferably, the glass composition of the present invention has an average thermal expansion coefficient of $60 \times 10^{-7}$/K to $90 \times 10^{-7}$/K in the range of 50 to 300° C. When the average thermal expansion coefficient is within the above range, even after the glass frit of the present invention is fired and softened on a soda lime glass substrate or glass substrate having a high strain point (strain point of 570° C. or more), cracks or warpage of the substrate are not occurred. The average thermal expansion coefficient in the range of 50 to 300° C. is preferably $65 \times 10^{-7}$/K or more. Further, the average thermal expansion coefficient in the range of 50 to 300° C. is preferably $85 \times 10^{-7}$/K or less, more preferably $80 \times 10^{-7}$/K or less. The average thermal expansion coefficient is a measurement value obtained using a thermo-mechanical analysis (TMA) apparatus.

The glass composition of the present invention contains, as essential ingredients, ZnO, $Bi_2O_3$, $P_2O_5$, and $Nb_2O_5$, and may contain, as optional ingredients, $ZrO_2$, BaO, $B_2O_3$, MgO, CaO, SrO, $Al_2O_3$, $TiO_2$, $V_2O_5$, $Y_2O_3$, $La_2O_3$, $Gd_2O_3$, $SnO_2$, $MoO_3$, and $WO_3$. Hereinafter, a detailed description will be given as to the glass composition of the present invention.

The glass composition of the present invention contains, in terms of mol % on the basis of oxides thereof, 4 to 32% of ZnO, 5 to 35% of $Bi_2O_3$, 10 to 30% of $P_2O_5$, 8 to 25% of $Nb_2O_5$, 0 to 5% of BaO, 0 to 17% of $B_2O_3$, 0 to 5% of MgO, 0 to 5% of CaO, 0 to 5% of SrO, 0 to 5% of $Al_2O_3$, 0 to 5% of $TiO_2$, 0 to 5% of $V_2O_5$, 0 to 5% of $Y_2O_3$, 0 to 5% of $La_2O_3$, 0 to 5% of $Gd_2O_3$, 0 to 5% of $SnO_2$, 0 to 5% of $MoO_3$, and 0 to 20% of $WO_3$. $ZrO_2$ is contained when the content of the $Bi_2O_3$ is 30 mol % or more, and a value obtained by dividing the sum of the content of the $Bi_2O_3$ and the content of the BaO by the content of the $Nb_2O_5$ is 0.3 to 2.5, and a lead oxide and an alkali metal oxide are not substantially contained. Hereinafter, if not specified otherwise, the mol % on the basis of oxide is simply expressed as "mol %".

An alkali metal oxide (such as $Li_2O$, $Na_2O$ and $K_2O$) potentially causes alkali migration and is not substantially contained.

A lead oxide potentially causes environmental pollution and is not substantially contained.

ZnO is the essential ingredient that has effects of suppressing an excessive increase of the average thermal expansion coefficient, greatly lowering the glass transition temperature and glass softening temperature, and imparting high refractive index. When the content of ZnO is less than 4 mol %, the effects is insufficiently achieved. When the content of ZnO is more than 32 mol %, higher tendency towards devitrification of the glass is caused. The content of ZnO is preferably 4 mol % or more, more preferably 10 mol % or more, particularly preferably 12 mol % or more. Further, the content of ZnO is preferably 32 mol % or less, more preferably 30 mol % or less, particularly preferably 28 mol % or less.

$Bi_2O_3$ is the essential ingredient that reduces the glass transition temperature and glass softening temperature, imparts high refractive index, and enhances the stability of the glass. When the content of $Bi_2O_3$ is less than 5 mol %, the effect is insufficiently achieved. On the other hand, when $Bi_2O_3$ is contained in an extremely high amount, the stability of the glass is deteriorated, the average thermal expansion coefficient is increased, and the acid resistance of the glass is deteriorated. Hence, the content of $Bi_2O_3$ is preferably 35 mol % or less, more preferably 30 mol % or less. Further, the content of $Bi_2O_3$ is preferably 10 mol % or more, more preferably 15 mol % or more.

$P_2O_5$ is the essential ingredient that forms the network structure as the skeleton of the glass and imparts the stability of the glass. When the content of $P_2O_5$ is less than 10 mol %, devitrification is easily caused. When the content of $P_2O_5$ is more than 30 mol %, the crystallization of the glass tends to be easily caused. The content of $P_2O_5$ is preferably 12 mol % or more, more preferably 14 mol % or more. Further, the content of $P_2O_5$ is preferably 25 mol % or less, more preferably 23 mol % or less.

$Nb_2O_5$ is the essential ingredient that imparts high refractive index, lowers the average thermal expansion coefficient, and enhances the acid resistance. When the content of $Nb_2O_5$ is less than 8 mol %, insufficient acid resistance is obtained. On the other hand, $Nb_2O_5$ may enhance the glass transition temperature and the glass softening temperature and the devitrification may be easily caused. Hence, the content of $Nb_2O_5$ is preferably 25 mol % or less, more preferably 20 mol % or less, particularly preferably 18 mol % or less. Further, the content of $Nb_2O_5$ is preferably 8 mol % or more, more preferably 10 mol % or more, particularly preferably 12 mol % or more.

BaO is an optional ingredient that enhances the stability of the glass. However, when the content of BaO is more than 5 mol %, the refractive index may be lowered, and the average thermal expansion coefficient, the glass transition temperature, and the glass softening temperature may be increased. Hence, the content of BaO is preferably 0 to 5 mol %.

Here, a value obtained by dividing the sum of the content of the $Bi_2O_3$ and the content of the BaO by the content of the $Nb_2O_5$ is 0.3 to 2.5. Among alkali earth compounds, when BaO is contained in the glass, the effect of lowering the acid resistance is large as well as the case of $Bi_2O_3$. On the other hand, $Nb_2O_5$ is a principal ingredient that enhances the acid resistance. The present inventors have found out that a value obtained by dividing the sum of the content of the $Bi_2O_3$ and the content of the BaO by the content of the $Nb_2O_5$ is an indicator of the acid resistance of the glass. When this value exceeds 2.5, the acid resistance thereof deteriorates, and thus, the value is preferably 2.5 or less. Further, the value is 0.3 or more. Generally, $Nb_2O_5$ is needed to provide a glass composition which is resistant to acids used during the ITO patterning. The glass containing $Nb_2O_5$ has high glass transition point and glass softening point, and thus, the fired film is hardly attached on the glass substrate by heating. For that reason, it is necessary to prepare a composition that reduces the glass transition point and the glass softening point. Accordingly, since $Bi_2O_3$ or BaO which has the effect of reducing the glass transition point and the glass softening point, these are contained at a ratio of 0.3 with respect to $Nb_2O_5$, thereby obtaining the effects that the acid resistance is excellent and the glass transition point and glass softening point are low.

$ZrO_2$ is an optional ingredient that enhances the stability of the glass. When the content of $ZrO_2$ is more than 5 mol %, there is a possibility that the stability of the glass is deteriorated and the glass transition temperature and glass softening temperature are increased. Hence, the content of $ZrO_2$ is preferably 0 to 5 mol %. In addition, when the content of $Bi_2O_3$ is more than 30 mol %, the crystallization of the glass is caused. To suppress the crystallization of the glass, the glass composition is needed to contain 1 to 5 mol % of $ZrO_2$ only if the content of $Bi_2O_3$ exceeds 30 mol %.

$B_2O_3$ is an optional ingredient that has the effect of enhancing the solubility of the glass. When the content of $B_2O_3$ is more than 17 mol %, there is a possibility that the devitrification or phase separation is easily caused and the high refractive index is difficult to be obtained. Hence, the content of $B_2O_3$ is preferably 0 to 17 mol %.

MgO, CaO, and SrO are optional ingredients that enhance the stability of the glass. However, when each of these contents is increased, there is a possibility that the refractive index is decreased and the average thermal expansion coefficient, glass transition temperature and glass softening temperature are increased. Hence, the content of these contents are preferably 0 to 5 mol %, respectively.

$Al_2O_3$ has the effect of deteriorating the stability of the glass, and its content is preferably less than 5 mol %, more preferably less than 3 mol %. It is further preferred that $Al_2O_3$ is not substantially contained.

$TiO_2$ is an optional ingredient that has the effect of imparting the high refractive index. However, there is a possibility that $TiO_2$ increases the glass transition temperature and glass softening temperature and easily causes devitrification. Hence, the content of $TiO_2$ is preferably 0 to 5 mol %.

$V_2O_5$ is an optional ingredient that has the effect of enhancing the stability of the glass and reducing the glass softening point. However, $V_2O_5$ is also an ingredient coloring the glass. Unless coloration of the glass is desirable, it is preferable to control the content of $V_2O_5$ within the acceptable range (0 to 5 mol %).

$Y_2O_3$ potentially deteriorates the stability of the glass. Hence, the content of $Y_2O_3$ is preferably controlled to be less than 5 mol %, more preferably less than 3 mol %. It is further preferred that $Y_2O_3$ is not substantially contained.

$La_2O_3$ potentially deteriorates the stability of the glass. Hence, the content of $La_2O_3$ is preferably controlled to be less than 5 mol %, more preferably less than 3 mol %. It is further preferred that $La_2O_3$ is not substantially contained.

$Gd_2O_3$ potentially deteriorates the stability of the glass. Hence, the content of $Gd_2O_3$ is preferably controlled to be less than 5 mol %, more preferably less than 3 mol %. It is further preferred that $Gd_2O_3$ is not substantially contained.

$SnO_2$ potentially deteriorates the stability of the glass. Hence, the content of $SnO_2$ is preferably controlled to be less than 5 mol %, more preferably less than 3 mol %. It is further preferred that $SnO_2$ is not substantially contained.

$MoO_3$ is an optional ingredient that has the effect of enhancing the stability of the glass and reducing the glass softening point. However, $MoO_3$ is also an ingredient coloring the glass. Unless coloration of the glass is desirable, it is preferable to control the content of $MoO_3$ within the acceptable range (0 to 5 mol %).

$WO_3$ is an optional ingredient that has the effect of imparting the high refractive index without greatly changing the average thermal expansion coefficient, glass transition temperature and glass softening temperature. It is also an ingredient useful to stabilize the glass. However, when the content of $WO_3$ is increased, there is a possibility that the coloration of the glass is increased and devitrification is easily caused. Hence, the content of $WO_3$ is preferably 0 to 20 mol %, more preferably 0 to 15 mol %, particularly preferably 0 to 13 mol %.

The glass composition of the present invention may further contain $TeO_2$, $GeO_2$, $Sb_2O_3$, $SiO_2$, $Ta_2O_3$, $Cs_2O_3$, or a transition metal oxide within the range that does not impair the effects of the present invention. The total content of those ingredients is preferably controlled to be less than 5 mol %, more preferably less than 3 mol %. It is further preferred that these are not substantially contained.

The glass composition of the present invention can be prepared by using ingredient materials such as oxides, phosphates, metaphosphates, carbonates, nitrates or hydroxides, weighing these so as to have a given composition, mixing them, melting the mixture in a crucible made of platinum or the like at a temperature of 950 to 1,500° C., and quenching by casting them in a mold or pouring into a space between a pair of rolls. A slow cooling may be adopted thereby to eliminate strain.

The glass frit of the present invention can be obtained by pulverizing the glass composition obtained in the above method with a mortar, a ball mill, a planetary mill, a jet mill or the like and, if necessary, classifying them. The mass average particle size of the glass frit is typically 0.5 to 10 µm. The surface of the glass frit may be modified with a surfactant or a silane coupling agent. Here, the mass average particle size is a particle size measured by a laser diffraction particle size distribution measurement method.

The light extracting member of the present invention has a structure where, as illustrated in FIG. 1, a light-scattering layer composed of glass is formed on a substrate, and an alkali-free cover glass is placed on the light-scattering layer. The thickness of the light-scattering layer is typically 5 to 50 µm. Preferably, the substrate as used herein has an average thermal expansion coefficient ($\alpha_{50-300}$) of $75 \times 10^{-7}$/K to $90 \times 10^{-7}$/K in the range of 50 to 300° C. As the substrate, examples thereof include soda lime glass or PD200 manufactured by Asahi Glass Co., Ltd., of which the surface may be coated with a silica film. The member can be typically obtained by, if necessary, mixing the glass fit with a solvent or a binder, applying them onto the substrate, firing at a temperature in the vicinity of the glass softening temperature of the glass frit to soften the glass frit, and then cooling to the room temperature. Examples of the solvent as used herein include a-terpinenol, butylcarbitol acetate, phthalic acid ester, 2,2,4-trimethyl-1,3-pentanediol mono-isobutylate, and the like. Examples of the binder include ethyl cellulose, acrylic resins, styrene resins, phenol resins, butyral resins, and the like. Other ingredients than the solvent or binder may also be contained. In the case of using a binder, it is preferable to include the step of firing at a temperature lower than the glass transition temperature to gasify the binder before softening the glass frit.

The light-scattering layer of the present invention may contain a light-scattering substance in the fired layer of the glass frit. It is of great importance to have the distribution of the light-scattering substance in the fired layer so that the quantity thereof is decreasing from the inside of the fired layer towards the surface thereof. Such a distribution of the light-scattering substance results in the decrease of the possibility to distribute the light-scattering substance in the surface layer of the fired layer of the glass frit in comparison with the possibility to distribute them in the inside thereof, thereby achieving the flat surface. Accordingly, in the case of forming an organic LED device, the translucent electrode layer or organic layer can be formed uniformly, and the electrode distance between the translucent electrode layer and a reflective electrode layer formed on the organic layer can be uniformed. This contributes to the long-life devices. The light-scattering substance has the case of bubbles, the case of material particles having a composition different from the glass frit or the case of crystals precipitated from the glass frit, and the light-scattering substance may be one of these cases or in the mixing state of these cases.

In the light extracting member of the present invention, a translucent electrode layer may be formed on the alkali-free cover glass layer by a deposition method, such as sputtering or the like. In the case of being used for an organic LED scattering layer, the refractive index of the translucent electrode layer is preferably not more than that of the glass fit, and by satisfying this requirement, the light emitted from the organic layer can be efficiently extracted. As the translucent electrode layer, typical example is ITO (Indium Tin Oxide), and $SnO_2$, ZrO, IZO (Indium Zinc Oxide) or the like may also be used.

EXAMPLES

Tables 1 to 8 present the glass compositions in terms of mol %, dissolution depth, refractive index ($n_d$), glass transition temperature ($T_g$), glass softening temperature ($T_s$), and average thermal expansion coefficient ($\alpha_{50-300}$), in the individual examples. Examples 1 to 53 correspond to Examples of the present invention, and Examples 54 to 62 correspond to Comparative Examples.

In all glass composition, as ingredient materials for each components, oxides, phosphates, metaphosphates, or carbonates were used. After vitrification, the ingredient materials were weighed so as to have the compositions shown in Table 1, followed by mixing sufficiently. The mixture was melt in an electric furnace using a crucible made of platinum at a temperature of 950 to 1,350° C., followed by casting in a mold made of carbon, and then, cast glass was cooled to the glass transition temperature, and immediately after that, it was put into an annealing furnace, and slowly cooled to the room temperature to thereby obtain each glass compositions. The melt glass was passed through a space between a pair of quenching rollers made of stainless steel to thereby form a flaky glass composition. This flaky glass composition was pulverized and classified, thereby obtaining a powdered glass composition.

The refractive index ($n_d$), glass transition temperature ($T_g$) and average thermal expansion coefficient ($\alpha_{50-300}$) in the range of 50 to 300° C. of the glass composition thus obtained were measured as follows.

(1) Dissolution Depth

A glass which had been formed into the flaky shape or cylindrical rod shape was dipped in a so-called ITO etchant solution composed of a 1:1 mixed solution of 45°Baumé ferric chloride (42 wt. % or more of $FeCl_3$) and hydrochloric acid (35 wt. % of HCl) at 40° C. for 10 minutes to measure the weight loss before and after the dipping and the dissolution depth was calculated from the weight loss, the specific gravity and surface area of the measurement sample.

(2) Refractive Index ($n_d$)

The glass was polished, and then the refractive index thereof was measured by using the V block method with a digital precise refractive index detector (KPR-2000, manufactured by Kalnew Optical Industries).

(3) Glass Transition Temperature ($T_g$)

The powdered glass composition was filled in a pan made of platinum, and it was measured at a temperature rising rate of 10° C./min with a differential thermal analysis measurement apparatus TG8110, manufactured by Rigaku Corp. The first folding point in a DTA chart obtained by the measurement was determined as the glass transition temperature.

(4) Glass Softening Temperature ($T_s$)

The powdered glass composition was filled in a pan made of platinum, and it was measured at a temperature rising rate of 10° C./min with a differential thermal analysis measurement apparatus TG8110, manufactured by Rigaku Corp. The fourth folding point in a DTA chart obtained by the measurement was determined as the glass softening temperature.

(5) Glass Crystallization Temperature ($T_c$)

The powdered glass composition was filled in a pan made of platinum, and it was measured at a temperature rising rate of 10° C./min with a differential thermal analysis measurement apparatus TG8110, manufactured by Rigaku Corp. The peak point appearing after the fourth folding point in a DTA chart obtained by the measurement was determined as the glass crystallization temperature.

(6) Difference Between Glass Crystallization Temperature and Glass Softening Temperature ($T_c - T_s$)

The difference between the glass crystallization temperature and the glass softening temperature was calculated. As the difference increases, the temperature range fluctuating during the firing step becomes wider, and thus, a good fired layer sufficiently sintered is easily obtained.

(7) Average Thermal Expansion Coefficient ($\alpha_{50-300}$) in the Range of 50 to 300° C.

The glass was processed into a cylindrical rod shape with a diameter of 5 mm and length of 200 mm, and then it was measured at a temperature rising rate of 10° C./min with a thermo-mechanical analysis apparatus TMA8310, manufactured by Rigaku Corp. Provided that the length of the glass rod at 50° C. was $L_{50}$ and the length of the glass rod at 300° C. was $L_{300}$, the average thermal expansion coefficient ($\alpha_{50-300}$) in the range of 50 to 300° C. was determined by the following equation:

$$\alpha_{50-300} = \{(L_{300}/L_{50}) - 1\}/(300-50)$$

TABLE 1

| | 1 mol % | 2 mol % | 3 mol % | 4 mol % | 5 mol % | 6 mol % | 7 mol % | 8 mol % |
|---|---|---|---|---|---|---|---|---|
| ZnO | 17.5 | 20.0 | 22.5 | 27.5 | 22.5 | 20.0 | 20.0 | 20.0 |
| $ZrO_2$ | 2.5 | 2.5 | | 2.5 | 2.5 | 5.0 | | |
| $Bi_2O_3$ | 32.5 | 30.0 | 27.5 | 24.0 | 24.0 | 24.0 | 22.5 | 22.5 |
| $P_2O_5$ | 22.5 | 22.5 | 22.5 | 20.0 | 20.0 | 20.0 | 20.0 | 20.0 |
| $Nb_2O_5$ | 16.0 | 16.0 | 16.0 | 16.0 | 16.0 | 16.0 | 16.0 | 16.0 |
| BaO | | | | | | | 2.5 | 5.0 |
| $B_2O_3$ | | | 2.5 | | 5.0 | 5.0 | 9.0 | 6.5 |
| MgO | | | | | | | | |
| CaO | | | | | | | | |
| SrO | | | | | | | | |
| $Al_2O_3$ | | | | | | | | |
| $TiO_2$ | | | | | | | | |
| $V_2O_5$ | | | | | | | | |
| $Y_2O_3$ | | | | | | | | |
| $La_2O_3$ | | | | | | | | |
| $Gd_2O_3$ | | | | | | | | |
| $SnO_2$ | | | | | | | | |
| $MoO_3$ | | | | | | | | |
| $WO_3$ | 9.0 | 9.0 | 9.0 | 10.0 | 10.0 | 10.0 | 10.0 | 10.0 |
| $Li_2O$ | | | | | | | | |
| $(Bi_2O_3 + BaO)/Nb_2O_5$ | 2.0 | 1.9 | 1.7 | 1.5 | 1.5 | 1.5 | 1.6 | 1.7 |
| Dissolution depth [µm] | 0.62 | 0.20 | 0.63 | 0.18 | 0.14 | 0.05 | 0.06 | 0.06 |
| $T_g$ [° C.] | 509 | 505 | 496 | 492 | 508 | 507 | 500 | 506 |
| $T_s$ [° C.] | 582 | 578 | 574 | 564 | 587 | 590 | 591 | 588 |
| $T_c$ [° C.] | 639 | 632 | 632 | 595 | 646 | 650 | 652 | 646 |
| $T_c - T_s$ [° C.] | 57 | 54 | 59 | 31 | 59 | 60 | 61 | 58 |
| $n_d$ | 2.12 | 2.10 | 2.07 | 2.07 | 2.05 | 2.06 | 2.03 | 2.03 |
| $\alpha$ (50-300° C.) [$10^{-7}$/K] | 78.8 | 77.1 | 76.5 | 74.4 | 73.5 | 72.0 | 74.5 | 77.9 |

TABLE 2

| | 9 mol % | 10 mol % | 11 mol % | 12 mol % | 13 mol % | 14 mol % | 15 mol % | 16 mol % |
|---|---|---|---|---|---|---|---|---|
| ZnO | 20.0 | 20.0 | 22.5 | 22.5 | 22.5 | 22.5 | 20.0 | 20.0 |
| $ZrO_2$ | 2.5 | 5.0 | | | | | 2.5 | 2.5 |
| $Bi_2O_3$ | 22.5 | 22.5 | 22.5 | 22.5 | 22.5 | 22.5 | 22.5 | 22.5 |
| $P_2O_5$ | 20.0 | 20.0 | 22.5 | 20.0 | 20.0 | 20.0 | 20.0 | 20.0 |
| $Nb_2O_5$ | 16.0 | 16.0 | 16.0 | 16.0 | 16.0 | 16.0 | 16.0 | 16.0 |
| BaO | 2.5 | | | 2.5 | | | | |

TABLE 2-continued

|  | 9 mol % | 10 mol % | 11 mol % | 12 mol % | 13 mol % | 14 mol % | 15 mol % | 16 mol % |
|---|---|---|---|---|---|---|---|---|
| $B_2O_3$ | 6.5 | 6.5 | 6.5 | 6.5 | 6.5 | 6.5 | 6.5 | 9.0 |
| MgO | | | | | | | | |
| CaO | | | | | 2.5 | | | |
| SrO | | | | | | 2.5 | 2.5 | |
| $Al_2O_3$ | | | | | | | | |
| $TiO_2$ | | | | | | | | |
| $V_2O_5$ | | | | | | | | |
| $Y_2O_3$ | | | | | | | | |
| $La_2O_3$ | | | | | | | | |
| $Gd_2O_3$ | | | | | | | | |
| $SnO_2$ | | | | | | | | |
| $MoO_3$ | | | | | | | | |
| $WO_3$ | 10.0 | 10.0 | 10.0 | 10.0 | 10.0 | 10.0 | 10.0 | 10.0 |
| $Li_2O$ | | | | | | | | |
| $(Bi_2O_3 + BaO)/Nb_2O_5$ | 1.6 | 1.4 | 1.4 | 1.6 | 1.4 | 1.4 | 1.4 | 1.4 |
| Dissolution depth [μm] | 0.05 | 0.03 | 0.07 | 0.10 | 0.06 | 0.04 | 0.01 | 0.03 |
| $T_g$ [° C.] | 509 | 508 | 503 | 498 | 500 | 501 | 511 | 504 |
| $T_s$ [° C.] | 592 | 592 | 583 | 584 | 585 | 588 | 596 | 582 |
| $T_c$ [° C.] | 652 | 670 | 648 | 653 | 654 | 652 | 660 | 658 |
| $T_c - T_s$ [° C.] | 59 | 78 | 65 | 70 | 69 | 64 | 64 | 76 |
| $n_d$ | 2.04 | 2.04 | 2.02 | 2.03 | 2.03 | 2.04 | 2.04 | 2.03 |
| α (50-300° C.) [$10^{-7}$/K] | 73.8 | 72.9 | 73.9 | 75.3 | 77.8 | 72.2 | 69.7 | 72.8 |

TABLE 3

|  | 17 mol % | 18 mol % | 19 mol % | 20 mol % | 21 mol % | 22 mol % | 23 mol % | 24 mol % |
|---|---|---|---|---|---|---|---|---|
| ZnO | 22.5 | 20.0 | 22.5 | 25.0 | 27.5 | 25.0 | 25.0 | 27.5 |
| $ZrO_2$ | 2.5 | | | | | | | |
| $Bi_2O_3$ | 22.5 | 22.5 | 22.5 | 22.5 | 20.0 | 20.0 | 22.5 | 22.5 |
| $P_2O_5$ | 20.0 | 20.0 | 20.0 | 20.0 | 17.5 | 17.5 | 15.0 | 15.0 |
| $Nb_2O_5$ | 16.0 | 16.0 | 16.0 | 16.0 | 16.0 | 16.0 | 16.0 | 16.0 |
| BaO | | | | | | | | |
| $B_2O_3$ | 6.5 | 11.5 | 9.0 | 6.5 | 9.0 | 11.5 | 11.5 | 9.0 |
| MgO | | | | | | | | |
| CaO | | | | | | | | |
| SrO | | | | | | | | |
| $Al_2O_3$ | | | | | | | | |
| $TiO_2$ | | | | | | | | |
| $V_2O_5$ | | | | | | | | |
| $Y_2O_3$ | | | | | | | | |
| $La_2O_3$ | | | | | | | | |
| $Gd_2O_3$ | | | | | | | | |
| $SnO_2$ | | | | | | | | |
| $MoO_3$ | | | | | | | | |
| $WO_3$ | 10.0 | 10.0 | 10.0 | 10.0 | 10.0 | 10.0 | 10.0 | 10.0 |
| $Li_2O$ | | | | | | | | |
| $(Bi_2O_3 + BaO)/Nb_2O_5$ | 1.4 | 1.4 | 1.4 | 1.4 | 1.3 | 1.3 | 1.4 | 1.4 |
| Dissolution depth [μm] | 0.02 | 0.04 | 0.04 | 0.10 | 0.10 | 0.10 | 0.10 | 0.10 |
| $T_g$ [° C.] | 504 | 499 | 495 | 497 | 491 | 497 | 491 | 492 |
| $T_s$ [° C.] | 584 | 583 | 579 | 576 | 578 | 584 | 567 | 567 |
| $T_c$ [° C.] | 658 | 650 | 655 | 656 | 645 | 657 | 617 | 614 |
| $T_c - T_s$ [° C.] | 74 | 67 | 76 | 80 | 67 | 74 | 50 | 47 |
| $n_d$ | 2.04 | 2.02 | 2.03 | 2.04 | 2.03 | 2.02 | 2.05 | 2.06 |
| α (50-300° C.) [$10^{-7}$/K] | 70.6 | 72.7 | 73.2 | 73.7 | 72.9 | 72.4 | 75.3 | 75.8 |

TABLE 4

|  | 25 mol % | 26 mol % | 27 mol % | 28 mol % | 29 mol % | 30 mol % | 31 mol % |
|---|---|---|---|---|---|---|---|
| ZnO | 30.0 | 27.5 | 25.0 | 25.0 | 25.0 | 22.5 | 22.5 |
| $ZrO_2$ | | | | | | | |
| $Bi_2O_3$ | 17.5 | 20.0 | 22.5 | 22.5 | 22.5 | 22.5 | 22.5 |
| $P_2O_5$ | 15.0 | 15.0 | 15.0 | 17.5 | 15.0 | 15.0 | 15.0 |

TABLE 4-continued

|  | 25 mol % | 26 mol % | 27 mol % | 28 mol % | 29 mol % | 30 mol % | 31 mol % |
|---|---|---|---|---|---|---|---|
| $Nb_2O_5$ | 16.0 | 16.0 | 16.0 | 16.0 | 16.0 | 16.0 | 16.0 |
| BaO |  |  |  |  |  |  |  |
| $B_2O_3$ | 11.5 | 11.5 | 11.5 | 9.0 | 11.5 | 11.5 | 11.5 |
| MgO |  |  |  |  |  |  |  |
| CaO |  |  |  |  |  |  |  |
| SrO |  |  |  |  |  | 2.5 |  |
| $Al_2O_3$ |  |  |  |  |  |  |  |
| $TiO_2$ |  |  |  |  |  |  |  |
| $V_2O_5$ |  |  |  |  |  |  |  |
| $Y_2O_3$ |  |  |  |  |  |  |  |
| $La_2O_3$ |  |  |  |  |  |  |  |
| $Gd_2O_3$ |  |  |  |  |  |  |  |
| $SnO_2$ |  |  |  |  |  |  | 2.5 |
| $MoO_3$ |  |  |  |  |  |  |  |
| $WO_3$ | 10.0 | 10.0 | 10.0 | 10.0 | 10.0 | 10.0 | 10.0 |
| $Li_2O$ |  |  |  |  |  |  |  |
| $(Bi_2O_3 + BaO)/Nb_2O_5$ | 1.1 | 1.3 | 1.4 | 1.4 | 1.4 | 1.4 | 1.4 |
| Dissolution depth [μm] | 0.10 | 0.10 | 0.10 | 0.10 | 0.10 | 0.10 | 0.10 |
| $T_g$ [° C.] | 498 | 493 | 491 | 491 | 491 | 495 | 499 |
| $T_s$ [° C.] | 576 | 572 | 567 | 578 | 567 | 578 | 581 |
| $T_c$ [° C.] | 617 | 625 | 617 | 626 | 617 | 627 | 642 |
| $T_c - T_s$ [° C.] | 41 | 53 | 50 | 48 | 50 | 49 | 61 |
| $n_d$ | 2.02 | 2.03 | 2.05 | 2.05 | 2.05 | 2.05 | 2.05 |
| α (50-300° C.) [$10^{-7}$/K] | 72.0 | 73.7 | 75.3 | 74.5 | 75.3 | 75.3 | 74.5 |

TABLE 5

|  | 32 mol % | 33 mol % | 34 mol % | 35 mol % | 36 mol % | 37 mol % | 38 mol % | 39 mol % |
|---|---|---|---|---|---|---|---|---|
| ZnO | 22.5 | 22.5 | 22.5 | 22.5 | 22.5 | 22.5 | 22.5 | 22.5 |
| $ZrO_2$ |  |  |  |  |  |  | 2.5 |  |
| $Bi_2O_3$ | 22.5 | 22.5 | 22.5 | 22.5 | 22.5 | 22.5 | 22.5 | 22.5 |
| $P_2O_5$ | 15.0 | 15.0 | 15.0 | 15.0 | 15.0 | 15.0 | 15.0 | 15.0 |
| $Nb_2O_5$ | 16.0 | 16.0 | 16.0 | 16.0 | 16.0 | 16.0 | 16.0 | 16.0 |
| BaO |  |  |  |  |  |  |  |  |
| $B_2O_3$ | 11.5 | 11.5 | 11.5 | 11.5 | 11.5 | 11.5 | 11.5 | 11.5 |
| MgO |  |  |  |  |  |  |  |  |
| CaO |  |  |  |  |  |  |  |  |
| SrO |  |  |  |  |  |  |  |  |
| $Al_2O_3$ |  |  |  | 2.5 |  |  |  |  |
| $TiO_2$ |  |  |  |  |  |  |  | 2.5 |
| $V_2O_5$ |  |  |  |  |  | 2.5 |  |  |
| $Y_2O_3$ |  |  | 2.5 |  |  |  |  |  |
| $La_2O_3$ | 2.5 |  |  |  |  |  |  |  |
| $Gd_2O_3$ |  |  |  | 2.5 |  |  |  |  |
| $SnO_2$ |  |  |  |  |  |  |  |  |
| $MoO_3$ |  |  |  |  | 2.5 |  |  |  |
| $WO_3$ | 10.0 | 10.0 | 10.0 | 10.0 | 10.0 | 10.0 | 10.0 | 10.0 |
| $Li_2O$ |  |  |  |  |  |  |  |  |
| $(Bi_2O_3 + BaO)/Nb_2O_5$ | 1.4 | 1.4 | 1.4 | 1.4 | 1.4 | 1.4 | 1.4 | 1.4 |
| Dissolution Depth [μm] | 0.10 | 0.10 | 0.10 | 0.10 | 0.10 | 0.10 | 0.10 | 0.10 |
| $T_g$ [° C.] | 498 | 498 | 498 | 500 | 487 | 495 | 499 | 495 |
| $T_s$ [° C.] | 581 | 582 | 583 | 583 | 568 | 577 | 579 | 575 |
| $T_c$ [° C.] | 640 | 640 | 640 | 644 | 636 | 637 | 625 | 625 |
| $T_c - T_s$ [° C.] | 60 | 59 | 58 | 61 | 68 | 61 | 46 | 50 |
| $n_d$ | 2.05 | 2.05 | 2.05 | 2.05 | 2.06 | 2.05 | 2.06 | 2.06 |
| α (50-300° C.) [$10^{-7}$/K] | 77.0 | 74.2 | 74.0 | 73.2 | 73.2 | 74.6 | 73.9 | 75.2 |

TABLE 6

|  | 40 mol % | 41 mol % | 42 mol % | 43 mol % | 44 mol % | 45 mol % | 46 mol % | 47 mol % |
|---|---|---|---|---|---|---|---|---|
| ZnO | 25.0 | 25.0 | 25.0 | 20.0 | 20.0 | 20.0 | 20.0 | 26.3 |
| $ZrO_2$ |  |  |  |  |  |  |  |  |
| $Bi_2O_3$ | 22.5 | 22.5 | 22.5 | 22.5 | 22.5 | 22.5 | 22.5 | 14.7 |
| $P_2O_5$ | 15.0 | 15.0 | 15.0 | 15.0 | 15.0 | 15.0 | 15.0 | 22.5 |

TABLE 6-continued

|  | 40 mol % | 41 mol % | 42 mol % | 43 mol % | 44 mol % | 45 mol % | 46 mol % | 47 mol % |
|---|---|---|---|---|---|---|---|---|
| $Nb_2O_5$ | 16.0 | 12.5 | 15.0 | 15.0 | 15.0 | 15.0 | 15.0 | 15.6 |
| BaO |  |  |  |  |  |  | 5.0 |  |
| $B_2O_3$ | 11.5 | 12.5 | 12.5 | 12.5 | 12.5 | 12.5 | 12.5 | 11.7 |
| MgO |  |  |  |  | 5.0 |  |  |  |
| CaO |  |  |  |  |  | 5.0 |  |  |
| SrO |  |  |  |  |  |  |  |  |
| $Al_2O_3$ |  |  |  |  |  | 5.0 |  |  |
| $TiO_2$ |  |  |  |  |  |  |  |  |
| $V_2O_5$ |  |  |  |  |  |  |  |  |
| $Y_2O_3$ |  |  |  |  |  |  |  |  |
| $La_2O_3$ |  |  |  |  |  |  |  |  |
| $Gd_2O_3$ |  |  |  |  |  |  |  |  |
| $SnO_2$ |  |  |  |  |  |  |  |  |
| $MoO_3$ |  |  |  |  |  |  |  |  |
| $WO_3$ | 10.0 | 10.0 | 10.0 | 10.0 | 10.0 | 10.0 | 10.0 | 9.2 |
| $Li_2O$ |  |  |  |  |  |  |  |  |
| $(Bi_2O_3 + BaO)/Nb_2O_5$ | 1.4 | 1.8 | 1.5 | 1.5 | 1.5 | 1.5 | 1.8 | 0.9 |
| Dissolution Depth [μm] | 0.06 | 0.60 | 0.36 | 0.34 | 0.28 | 0.47 | 0.73 | 0.45 |
| $T_g$ [° C.] | 495 | 487 | 493 | 500 | 508 | 512 | 496 | 489 |
| $T_s$ [° C.] | 586 | 567 | 574 | 584 | 597 | 601 | 580 | 583 |
| $T_c$ [° C.] | 658 | 626 | 634 | 655 | 677 | 671 | 646 | 677 |
| $T_c - T_s$ [° C.] | 72 | 59 | 60 | 71 | 80 | 70 | 66 | 94 |
| $n_d$ | 2.05 | 2.03 | 2.04 | 2.04 | 2.04 | 2.04 | 2.04 | 1.93 |
| a (50-300° C.) [$10^{-7}$/K] | 76.4 | 75.2 | 76.0 | 77.4 | 77.6 | 77.8 | 80.5 | 67 |

TABLE 7

|  | 48 mol % | 49 mol % | 50 mol % | 51 mol % | 52 mol % | 53 mol % | 54 mol % | 55 mol % |
|---|---|---|---|---|---|---|---|---|
| ZnO | 25.8 | 25.9 | 26.7 | 21.7 | 27.2 | 29.0 | 20.6 | 22.5 |
| $ZrO_2$ |  |  |  |  | 3.0 |  |  |  |
| $Bi_2O_3$ | 14.4 | 14.5 | 14.9 | 15.6 | 15.2 | 16.2 | 14.9 | 30.0 |
| $P_2O_5$ | 22.1 | 22.2 | 22.8 | 23.9 | 23.3 | 24.7 | 22.7 | 22.5 |
| $Nb_2O_5$ | 17.2 | 15.4 | 15.8 | 16.6 | 16.1 | 17.2 | 15.7 | 16.0 |
| BaO |  |  |  |  |  |  |  |  |
| $B_2O_3$ | 11.5 | 12.9 | 10.5 | 12.4 | 12.1 | 12.9 | 11.8 |  |
| MgO |  |  |  |  |  |  |  |  |
| CaO |  |  |  |  |  |  |  |  |
| SrO |  |  |  |  |  |  |  |  |
| $Al_2O_3$ |  |  |  |  |  |  |  |  |
| $TiO_2$ |  |  |  |  |  |  |  |  |
| $V_2O_5$ |  |  |  |  |  |  |  |  |
| $Y_2O_3$ |  |  |  |  |  |  |  |  |
| $La_2O_3$ |  |  |  |  |  |  |  |  |
| $Gd_2O_3$ |  |  |  |  |  |  |  |  |
| $SnO_2$ |  |  |  |  |  |  |  |  |
| $MoO_3$ |  |  |  |  |  |  |  |  |
| $WO_3$ | 9.0 | 9.1 | 9.3 | 9.8 | 3.1 |  | 9.3 | 9.0 |
| $Li_2O$ |  |  |  |  |  |  | 5.0 |  |
| $(Bi_2O_3 + BaO)/Nb_2O_5$ | 0.8 | 0.9 | 0.9 | 0.9 | 0.9 | 0.9 | 0.9 | 1.9 |
| Dissolution depth [μm] | 0.36 | 0.47 | 0.45 | 0.05 | 0.12 | 0.98 | 0.16 | 1.30 |
| $T_g$ [° C.] | 495 | 491 | 492 | 505 | 498 | 500 | 479 | 496 |
| $T_s$ [° C.] | 587 | 587 | 585 | 607 | 608 | 590 | 577 | 569 |
| $T_c$ [° C.] | 669 | 680 | 680 | 718 | 694 | 689 | 693 | 617 |
| $T_c - T_s$ [° C.] | 82 | 93 | 95 | 111 | 94 | 99 | 116 | 48 |
| $n_d$ | 1.96 | 1.93 | 1.95 | 1.96 | 1.94 | 1.93 | 1.94 | 2.09 |
| a (50-300° C.) [$10^{-7}$/K] | 65 | 67 | 67 | 65 | 65 | 65 | 70.1 | 78.6 |

TABLE 8

|  | 56 mol % | 57 mol % | 58 mol % | 59 mol % | 60 mol % | 61 mol % | 62 mol % |
|---|---|---|---|---|---|---|---|
| ZnO |  | 35.0 | 25.0 | 20.0 | 15.0 | 25.0 | 25.0 | 10.0 |
| $ZrO_2$ |  |  |  |  | 5.0 |  | 5.0 |

TABLE 8-continued

|  | 56 mol % | 57 mol % | 58 mol % | 59 mol % | 60 mol % | 61 mol % | 62 mol % |
|---|---|---|---|---|---|---|---|
| $Bi_2O_3$ | 22.5 | 22.5 | 22.5 | 22.5 | 22.5 | 22.5 | 30.0 |
| $P_2O_5$ | 15.0 | 15.0 | 15.0 | 15.0 | 15.0 | 15.0 | 10.0 |
| $Nb_2O_5$ | 16.0 |  | 16.0 | 12.5 |  |  | 7.5 |
| BaO |  |  |  | 10.0 |  |  |  |
| $B_2O_3$ | 11.5 | 11.5 | 11.5 | 12.5 | 12.5 | 12.5 | 25.0 |
| MgO |  |  |  |  |  |  |  |
| CaO |  |  |  |  |  |  |  |
| SrO |  |  |  |  |  |  | 2.5 |
| $Al_2O_3$ |  |  |  |  |  |  |  |
| $TiO_2$ |  | 16.0 |  |  |  |  | 5.0 |
| $V_2O_5$ |  |  |  |  |  |  |  |
| $Y_2O_3$ |  |  |  |  |  |  |  |
| $La_2O_3$ |  |  |  |  |  |  |  |
| $Gd_2O_3$ |  |  |  |  |  |  |  |
| $SnO_2$ |  |  |  |  |  |  |  |
| $MoO_3$ |  |  |  |  |  |  |  |
| $WO_3$ |  | 10.0 | 10.0 | 12.5 | 20.0 | 25.0 | 5.0 |
| $Li_2O$ |  |  | 5.0 |  |  |  |  |
| $(Bi_2O_3 + BaO)/Nb_2O_5$ | 1.4 |  | 1.4 | 2.6 |  |  | 4.0 |
| Dissolution depth [μm] | 5.46 | 54.58 | 0.08 | 5.46 | 80.05 | 72.56 | 25.82 |
| $T_g$ [° C.] | 488 | 476 | 466 | 505 | 469 | 458 | 486 |
| $T_s$ [° C.] | 563 | 565 | 564 | 593 | 543 | 536 | 561 |
| $T_c$ [° C.] | 610 | 649 | 606 | 653 | 596 | 595 | 649 |
| $T_c - T_s$ [° C.] | 46 | 84 | 42 | 61 | 53 | 59 | 88 |
| $n_d$ | 2.04 | 1.99 | 2.05 | 2.02 | 1.96 | 1.97 | 2.06 |
| a (50–300° C.) [$10^{-7}$/K] | 76.0 | 88.0 | 78.9 | 87.3 | 85.3 | 88.2 | 84.3 |

While the invention has been described in detail and with reference to specific embodiments thereof, it will be apparent to one skilled in the art that various changes and modifications can be made therein without departing from the spirit and scope of the invention.

This application is based on Japanese Patent Application No. 2010-167092 filed on Jul. 26, 2010, the contents of which are incorporated herein by reference.

Industrial Applicability

According to the present invention, the glass composition which does not contain a lead oxide and an alkali metal oxide, exhibits high acid resistance, and further has high refractive index and low temperature softening property can be applied to an optical member. Particularly, the present invention can provide a glass frit suitable for a cover layer of the light-scattering layer capable of enhancing light extraction of an organic LED. The glass of the present invention does not substantially contain an alkali metal and thus does not have an adverse effect caused by alkali migration on the organic LED device. The glass of the present invention has a sufficiently high acid resistance and thus enables to pattern the ITO thin film formed on the glass by etching with an acid. Moreover, the glass frit of the present invention can achieve that, after the glass frit is fired and softened on the glass substrate (for example, PD200 substrate, manufactured by Asahi Glass Co., Ltd.), deformation of the substrate and unacceptable warpage of the substrate are not occurred, and cracks of the substrate are also not occurred

DESCRIPTION OF REFERENCE NUMERALS AND SIGNS

100 Substrate
110 Light-scattering layer
120 Alkali-free cover glass

The invention claimed is:

1. An alkali-free cover glass composition, which: does not substantially contain a lead oxide and an alkali metal oxide; has a refractive index ($n_d$) of 1.7 to 2.3; has a glass transition temperature of 530° C. or less; has a dissolution depth of less than 1.3 μm as measured and calculated by an acid dipping weight loss measurement method; and comprising, in terms of mol % on the basis of oxides thereof:

4 to 32% of ZnO;
    5 to 35% of $Bi_2O_3$;
    10 to 30% of $P_2O_5$;
    8 to 25% of $Nb_2O_5$; and
    0 to 5% of BaO,
    wherein when a content of the $Bi_2O_3$ is 30 mol % or more, $ZrO_2$ is contained in an amount of 1 to 5%,
    a value obtained by dividing a sum of a content of the $Bi_2O_3$ and a content of the BaO by a content of the $Nb_2O_5$ is 0.3 to 2.5.

2. An alkali-free cover glass composition, comprising, in terms of mol % on the basis of oxides thereof:

4 to 32% of ZnO;
    5 to 35% of $Bi_2O_3$;
    10 to 30% of $P_2O_5$;
    8 to 25% of $Nb_2O_5$; and
    0 to 5% of BaO,
    wherein when a content of the $Bi_2O_3$ is 30 mol % or more, $ZrO_2$ is contained in an amount of 1 to 5%,
    a value obtained by dividing a sum of a content of the $Bi_2O_3$ and a content of the BaO by a content of the $Nb_2O_5$ is 0.3 to 2.5, and
    the alkali-free cover glass composition does not substantially contain a lead oxide and an alkali metal oxide.

3. The alkali-free cover glass composition according to claim 2, comprising, in terms of mol % on the basis of oxides thereof:

0 to 17% of $B_2O_3$;
    0 to 5% of $ZrO_2$;
    0 to 5% of MgO;
    0 to 5% of CaO;
    0 to 5% of BaO;
    0 to 5% of SrO;

0 to 5% of $TiO_2$;
0 to 5% of $V_2O_5$;
0 to 5% of $MoO_3$; and
0 to 20% of $WO_3$.

4. A light extracting member, comprising:
a substrate;
a light-scattering layer having a light-scattering property and being placed on the substrate; and
an alkali-free cover glass layer being placed on the light-scattering layer and composed of a glass composition, wherein the glass composition does not substantially contain a lead oxide and an alkali metal oxide; has a refractive index ($n_d$) of 1.7 to 2.3; has a glass transition temperature of 530° C. or less; has a dissolution depth of less than 1.3 μM as measured by an acid dipping weight loss measurement method; and comprising, in terms of mol % on the basis of oxides thereof:
4 to 32% of ZnO;
5 to 35% of $Bi_2O_3$;
10 to 30% of $P_2O_5$;
8 to 25% of $Nb_2O_5$; and
0 to 5% of BaO,
wherein when a content of the $Bi_2O_3$ is 30 mol % or more, $ZrO_2$ is contained in an amount of 1 to 5%,
a value obtained by dividing a sum of a content of the $Bi_2O_3$ and a content of the BaO by a content of the $Nb_2O_5$ is 0.3 to 2.5.

* * * * *